United States Patent
Takeuchi et al.

(10) Patent No.: US 6,934,312 B2
(45) Date of Patent: Aug. 23, 2005

(54) SYSTEM AND METHOD FOR FABRICATING EFFICIENT SEMICONDUCTOR LASERS VIA USE OF PRECURSORS HAVING A DIRECT BOND BETWEEN A GROUP III ATOM AND A NITROGEN ATOM

(75) Inventors: Tetsuya Takeuchi, Sunnyvale, CA (US); Michael Tan, Menlo Park, CA (US); Ying-Ian Chang, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 156 days.

(21) Appl. No.: 10/261,754

(22) Filed: Sep. 30, 2002

(65) Prior Publication Data

US 2004/0062283 A1 Apr. 1, 2004

(51) Int. Cl.[7] ................................................. H01S 5/00
(52) U.S. Cl. ............................. 372/45; 372/43; 372/46; 438/507
(58) Field of Search ..................... 372/45, 46; 257/200; 438/507

(56) References Cited

U.S. PATENT DOCUMENTS

| | | | | |
|---|---|---|---|---|
| 5,583,189 A | * | 12/1996 | Geerts et al. | 526/128 |
| 5,795,798 A | * | 8/1998 | Mishra et al. | 438/35 |
| 5,805,624 A | * | 9/1998 | Yang et al. | 372/45 |
| 5,926,726 A | * | 7/1999 | Bour et al. | 438/507 |
| 6,194,310 B1 | * | 2/2001 | Hsu et al. | 438/643 |
| 6,455,340 B1 | * | 9/2002 | Chua et al. | 438/31 |
| 6,469,324 B1 | * | 10/2002 | Wang | 257/98 |
| 6,495,449 B1 | * | 12/2002 | Nguyen | 438/627 |
| 2001/0017820 A1 | * | 8/2001 | Akiyama et al. | 369/13 |
| 2003/0006429 A1 | * | 1/2003 | Takahashi et al. | 257/200 |

OTHER PUBLICATIONS

M. C. Larson, M. Kondow, T. Kitatani, N. Nakahara, K. Tamura, H. Inoue, and K. Uomi, IEEE Photon. Technol. Lett., 10 (1998) 188.

S. Sato and S. Satoh, IEEE Photo. Tech. Lett, 11 (1999) 1560.

E. Bourret–Courchesne, Q. Ye, D.W. Peters, J. Arnold, M. Ahmed, S.J.C. Irvine, R. Kanjolia, L.M. Smith, S.A. Rushworth, J. Cryst. Growth 217 (2000) 47.

R. M. Sieg, A. A. Allermann, S.R. Kurtz, E.D. Jones, O.B. Spahn, T1 EMC Jun. 2000, p. 43.

T. Miyamoto, S. Sato, Z. Pan, D. Schlenker, F. Koyama, and K. Iga, J. Cryst. Growth 195 (1998) 421.

C.H. Chen, C.A. Larssen, and G.B. Stringfellow, Appl. Phys. Lett., 50 (1987) 218.

B.J. Bae, J.E. Park, B. Kim, and J.T. Park, J. Organo. Chem. 616 (2000) 128.

A. Miehr, O. Ambacher, W. Rieger, T. Metzger, E. Born, and R.A. Fischer, Chem. Vapor Depo. 2 (1996) 51.

Y. Kim, H.H. Kim, J.E. Park, B.J. Bae, B. Kim, J.T. Park, K.–S. Yu, and Y. Kim, Thin Solid Films 339 (1999) 200.

T. Kitatani, K. Nakahara, M. Kondow, K. Uomi, and T. Tanaka, J. Cryst. Growth 209 (2000) 345.

* cited by examiner

*Primary Examiner*—Minsun Oh Harvey
*Assistant Examiner*—Dung (Michael) T Nguyen

(57) ABSTRACT

A system for fabricating a light emitting device is disclosed. The system contains a growth chamber and at least one nitrogen precursor that is introduced to the growth chamber. The at least one nitrogen precursor has a direct bond between at least one group III atom and at least one nitrogen atom. In addition, the nitrogen precursor is used to fabricate a layer constituting part of an active region of the light emitting device containing indium, gallium, arsenic, and nitrogen, wherein the active region produces light having a wavelength in the range of approximately 1.2 to 1.6 micrometers. A method for fabricating a semiconductor structure is also disclosed. The method comprises providing a substrate and growing over the substrate a layer comprising indium, gallium, arsenic, and nitrogen using at least one nitrogen precursor having a direct bond between at least one group III atom and at least one nitrogen atom.

27 Claims, 6 Drawing Sheets

SYSTEM AND METHOD FOR FABRICATING EFFICIENT SEMICONDUCTOR LASERS VIA USE OF PRECURSORS HAVING A DIRECT BOND BETWEEN A GROUP III ATOM AND A NITROGEN ATOM

FIELD OF THE INVENTION

The present invention generally relates to semiconductor devices and, more particularly, is related to semiconductor laser fabrication.

BACKGROUND OF THE INVENTION

With advances in technology, there is a continuous demand to increase data transmission rates and volume of data transmission. Traditional communication lines, such as cable containing copper wire, have been used to cater to this continuously growing demand, however, traditional communication lines are subject to many disadvantages. Traditional communication lines are susceptible to interference during the transmission of data. Examples of such interference include, but are not limited to, electromagnetic interference and inter-symbol interference. Traditional communication lines are also characterized by a limited bandwidth, thereby limiting the amount of data that may be transmitted via traditional communication lines.

Fiber-optic telecommunication systems have been introduced to the telecommunication industry to overcome the shortcomings of traditional communication lines. Fiber-optic telecommunication systems are characterized by immunity to electromagnetic interference. Specifically, fiber-optic telecommunication uses optical fiber for the transmission of information. Since optical fiber transmits light, rather than electrons, optical fiber does not radiate electromagnetic fields. In addition, fiber-optic telecommunication systems have high bandwidths for the transmission of information. As is known by those of ordinary skill in the art, high bandwidth permits longer transmission distances and higher signal transmission rates.

A basic fiber-optic network contains a transmitter, a fiber-optic cable, and a receiver. The transmitter contains a light-emitting diode (LED), laser diode (LD), an edge-emitting laser, a vertical cavity surface-emitting laser (VCSEL), or any other device that converts an electrical signal into an optical signal for transmission via the fiber-optic cable. The receiver typically contains a photodiode that converts the transmitted light back into an electrical signal, and an amplifier for enabling easier detection of the electrical signal via amplification of the electrical signal.

It is generally desirable for lasers that are used in fiber optic telecommunication systems to produce light at a single, relatively long wavelength, in the range from approximately 1.2–1.6 micrometers ($\mu$m). Light in the wavelength range from approximately 1.2–1.6 $\mu$m can be transmitted by an optical fiber with relatively little loss of signal intensity, attenuation, or absorption over long distances. However, emission in the range of 1.2–1.6 $\mu$m requires the semiconductor laser to be fabricated from materials having a corresponding bandgap energy. Photons in semiconductors are further discussed in B. Saleh et al., *Fundamentals of Photonics*, pp. 543–643 (1991), which is incorporated herein by reference.

Currently, a semiconductor laser operating in the 1.3 $\mu$m wavelength region is grown using indium gallium arsenide phosphide (InGaAsP) in its active region on an InP wafer. However, it is difficult to grow high quality distributed Bragg reflectors (DBRs) of a vertical cavity surface-emitting laser (VCSEL) using InGaAsP material. Therefore, InGaAsP lasers typically have DBRs of materials other than InGaAsP.

Indium gallium arsenide nitride (InGaAsN) is an attractive material for the active region of long wavelength edge-emitting lasers and VCSELs since high-quality InGaAsN can be grown on a gallium arsenide (GaAs) wafer. The juxtaposition InGaAsN and GaAs results in a high conduction band offset. Moreover, such devices can use highly-reflective GaAs/aluminum arsenide (AlAs) DBRs. However, using InGaAsN in a semiconductor gives rise to significant manufacturing challenges.

InGaAsN edge-emitting lasers and VCSELs capable of continuous wave operation are typically grown by metalorganic chemical vapor deposition (MOCVD), which is generally suitable for mass production. Dimethylhydrazine (DMHy) has been used as a nitrogen precursor in InGaAsN MOCVD growth. This nitrogen precursor, DMHy, has a few advantages. DMHy has a low decomposition temperature and therefore is suitable for InGaAsN MOCVD growth where the growth temperature is typically low (500–600 degrees Celsius). In addition, DMHy is a liquid and has reasonably high vapor pressure at room temperature.

There are, however, negative aspects associated with the use of DMHy as a nitrogen precursor. In order to obtain a laser capable of emission in the 1.3 $\mu$m range, for instance, InGaAsN having a mole fraction of $In_{0.38}Ga_{0.62}As_{0.99}N_{0.01}$ is required. However, due to extremely low N incorporation in InGaAsN by MOCVD with DMHy as the N precursor, a ratio of more than 95% DMHy/total group-V precursor ratio is supplied to an MOCVD reactor to obtain 1% N/total group-V atoms in solid composition, resulting in large consumption of DMHy. In addition, the following InGaAsN quality issues result from use of DMHy as a nitrogen precursor.

In order to enhance N incorporation in InGaAsN and to achieve a very high DMHy/total group-V precursor ratio (e.g., more than 95%), a very low As/group III ratio (e.g., approximately 5%) is required. Unfortunately, a low As/group III ratio typically causes poor material quality in GaAs based semiconductors. In accordance with the example characterized by a very high DMHy/total group-V precursor ratio and a very low As/group III ratio, the ratio of precursor for group III, As, and N is 1:5:100. In addition, the sticking coefficient of N for the example is estimated to be approximately 0.0001.

Another negative aspect associated with the use of DMHy as a nitrogen precursor is that the purity of DMHy is currently difficult to control, especially for residual water level. Water contamination in DMHy causes poor material quality of semiconductors. As mentioned above, a laser operating with a wavelength of approximately 1.3 $\mu$m requires a large DMHy/total group-V precursor ratio for InGaAsN growth. The required large ratio results in a large amount of DMHy being supplied to the MOCVD reactor, resulting in opportunities for the incorporation of impurities, such as, but not limited to, oxygen, into the InGaAsN.

In addition, the incorporation of N is proportional to the mole fraction composition of In in InGaAsN. Higher In fractions tend to dramatically reduce N incorporation in InGaAsN. Therefore, it is difficult to obtain 1.55 $\mu$m emission from InGaAsN, which should have 40% In and 3% N, by MOCVD growth and with using DMHy as a N precursor.

Therefore, it is desirable to find more suitable nitrogen precursors for growth of high quality InGaAsN for semiconductor lasers such as, but not limited to, edge-emitting lasers and surface-emitting lasers.

SUMMARY OF THE INVENTION

In light of the foregoing, the invention generally relates to a system and method for fabricating an efficient semiconductor laser having emission in the range of 1.2 to 1.6 micrometers.

Generally, with reference to the structure of the system, the system contains a growth chamber and at least one nitrogen precursor that is introduced to the growth chamber. The nitrogen precursor has a direct bond between at least one group III atom and at least one nitrogen atom and is introduced to the growth chamber to fabricate a layer constituting part of an active region of a light emitting device comprising indium, gallium, arsenic and nitrogen, wherein the active region produces light having a wavelength in a range of approximately 1.2 to 1.6 micrometers.

The present invention can also be viewed as providing a method for fabricating a semiconductor structure. In this regard, the method can be broadly summarized by the following: providing a substrate; and growing over the substrate a layer comprising indium, gallium, arsenic and nitrogen using at least one nitrogen precursor having a direct bond between at least one group III atom and at least one nitrogen atom.

Due to the present nitrogen precursor having a group III-N direct bond, the nitrogen precursor has a high sticking coefficient and therefore, a large supply of N precursor is not necessary to obtain a relatively high N incorporation in InGaAsN. In addition, by using the present nitrogen precursors, InGaAsN can be grown under higher growth temperature and a high As/group III ratio, which typically enables growth of high quality GaAs-based materials. Further, there is less possibility that impurities will be incorporated into InGaAsN layers due to low N precursor supply. The high sticking coefficient of the present N precursors also equates to ease in obtaining higher N composition in InGaAsN with a higher mole fraction of In.

Other systems and methods of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components of the drawings are not necessarily to scale, emphasis instead being placed upon clearly illustrating the principles of the present invention. Moreover, in the drawings, like referenced numerals designate corresponding parts throughout the several views.

DETAILED DESCRIPTION

Figure 1:
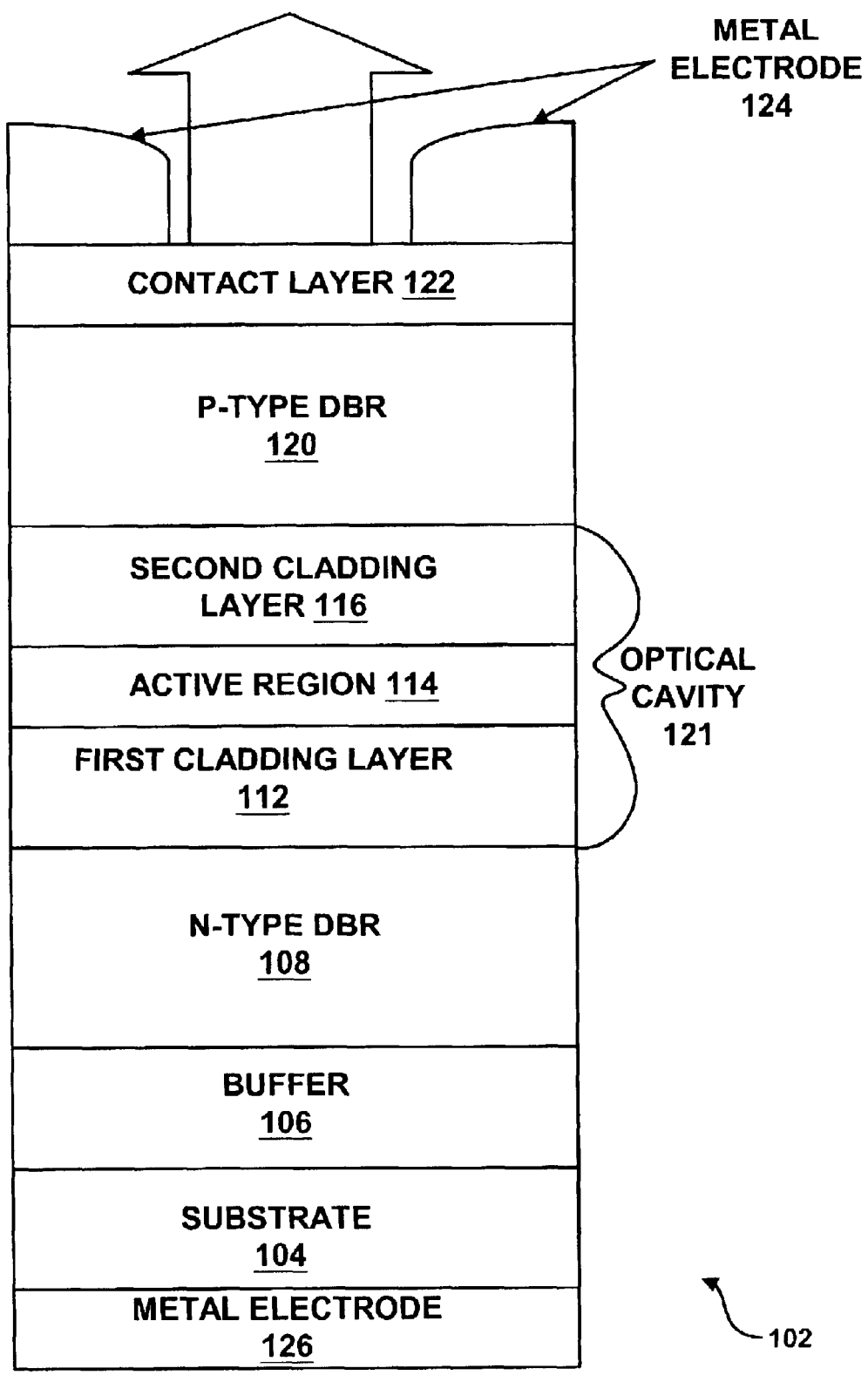
FIG. 1 is a schematic diagram illustrating an example of a VCSEL, a portion of which contains an InGaAsN layer created via use of the present precursors.

While the present description and embodiments provided herein refer to a semiconductor laser fabrication system and method, it should be noted that the present system and method may be utilized for other light emitting devices, such as a light emitting diode (LED).

The semiconductor laser fabrication system and method use a nitrogen precursor having a direct bond between a group III atom and a nitrogen atom to fabricate an InGaAsN layer. InGaAsN is an attractive material used in semiconductor lasers since InGaAsN can be grown on GaAs wafers. The use of InGaAsN results in a higher conduction band offset and enables highly reflective GaAs/AlAs distributed Bragg reflectors to be used. In addition, a semiconductor laser having InGaAsN in its active region can produce light having relatively long wavelength, in the range of approximately 1.2–1.6 $\mu$m. Light in this wavelength range is transmitted by an optical fiber with relatively little loss of light intensity over long distances. Further, use of the present nitrogen precursor for growing InGaAsN enables efficient mass production of edge-emitting lasers and surface-emitting lasers that use InGaAsN, as described below.

It should be noted that the InGaAsN layers fabricated using the present N precursor may be located not only within opto-electronic devices such as lasers, but also within electronic devices such as high electron mobility transistors and heterojunction bipolar transistors.

The present semiconductor laser fabrication system and method use precursors in which there is a direct bond between a group III atom and a nitrogen atom (group III-N direct bond), such as a gallium-nitrogen (Ga—N) direct bond or an indium-nitrogen (In—N) direct bond. A direct bond between two elements is a bond in which an atom of the first element is bonded to one or more atoms of the second element without one or more atoms of another element located between the atom of the first element and the atom of the second element.

Due to the group III atoms, such as Ga and/or In, precursors having a group III-N direct bond have a very high sticking coefficient. The sticking coefficient is close to unity with reference to a growth surface. The sticking coefficient is a measure of the fraction of incident atoms that attach to a given surface. Examples of precursors having direct bonds between group III atoms and nitrogen atoms include, but are not limited to, diethylgallium azide $(C_2H_5)_2GaN_3$, dimethylgallium amide $(CH_3)_2GaNH_2$, dimethylamino diethylgallium $(C_2H_5)_2GaN(CH_3)_2$, diethylindium azide $(C_2H_5)_2InN_3$, dimethylindium amide $(CH_3)_2InNH_2$, and dimethylamino diethylindium $(C_2H_5)_2InN(CH_3)_2$.

Due to the high sticking coefficient (e.g., approximately one) of the present precursors, a large supply of N precursor is not necessary to obtain a relatively high N incorporation in InGaAsN. For instance, the required flow rate of the present precursors having group III-N direct bonds for $In_{0.38}Ga_{0.62}As_{0.99}N_{0.01}$, is approximately one thousand (1000) times lower than the required flow rate of DMHy, as estimated from the difference in sticking coefficients. In addition, N incorporation into InGaAsN layers using the present precursors has little dependence on the mole fraction of In in InGaAsN, the As/group III ratio, and growth temperature. Therefore, by using the present precursors, InGaAsN can be grown at a higher growth temperature and with a high As/group III ratio (more than 40). These conditions typically enable growth of high quality GaAs-based materials. In addition, there is less possibility that impurities will be incorporated into InGaAsN layers due the lower N precursor supply.

Further, as explained below, the high sticking coefficient of the present precursors equates to ease in obtaining a higher N composition in InGaAsN with a higher mole fraction of In. For example, InGaAsN with more than one percent (1%) N may be grown with a higher mole fraction of In. The high sticking coefficient of the present precursors results in successful growth of InGaAsN with approximately forty percent (40%) In and three percent (3%) N, which corresponds to light emission at 1.55 μm in semiconductor lasers.

Furthermore, by selecting the supply ratio of precursors containing In—N and Ga—N direct bonds, it is possible to control the number of In—N direct bonds and the number of Ga—N direct bonds that exist in the InGaAsN layers. When using DMHy, or any precursor not having a direct bond between the group III atom and the N atom, it is not possible to control whether the Ga or In bonds with a N atom during growth of the InGaAsN layers. The ability to control the number of In—N direct bonds and the number of Ga—N direct bonds results in a further opportunity to optimize quality of the InGaAsN layers.

Further discussion of the above precursors is provided below. It should be noted that while the following describes the use of InGaAsN within semiconductor lasers, the process used to fabricate InGaAsN may be used in the fabrication of other devices requiring InGaAsN.

Vertical Cavity Surface-Emitting Laser

The following describes a vertical cavity surface-emitting laser (VCSEL) that may be fabricated using the present semiconductor laser fabrication system and method, wherein precursors containing Ga—N and/or In—N direct bonds are used to form the active region of the VCSEL. FIG. 1 is a schematic diagram illustrating a VCSEL 102 in accordance with a first exemplary embodiment of the invention, the active layer of which contains InGaAsN fabricated via use of the present fabrication system and method. The high sticking coefficient of precursors containing Ga—N and/or In—N direct bonds results in improved N incorporation in InGaAsN even with a higher In mole fraction. As an example, the high sticking coefficient provides successful growth of InGaAsN having forty percent (40%) In and three percent (3%) N, which corresponds to light emission at a wavelength of approximately 1.55 μm.

The VCSEL 102 contains several layers, each of which is discussed in detail below. Specifically, describing the structure of the VCSEL 102, the VCSEL 102 contains a GaAs substrate 104, the bottom of which has an n-type electrode layer 126 located thereon. A buffer layer 106, composed of GaAs, is located on the GaAs substrate 104. An n-type DBR 108 is located on the buffer layer 106.

Figure 3:
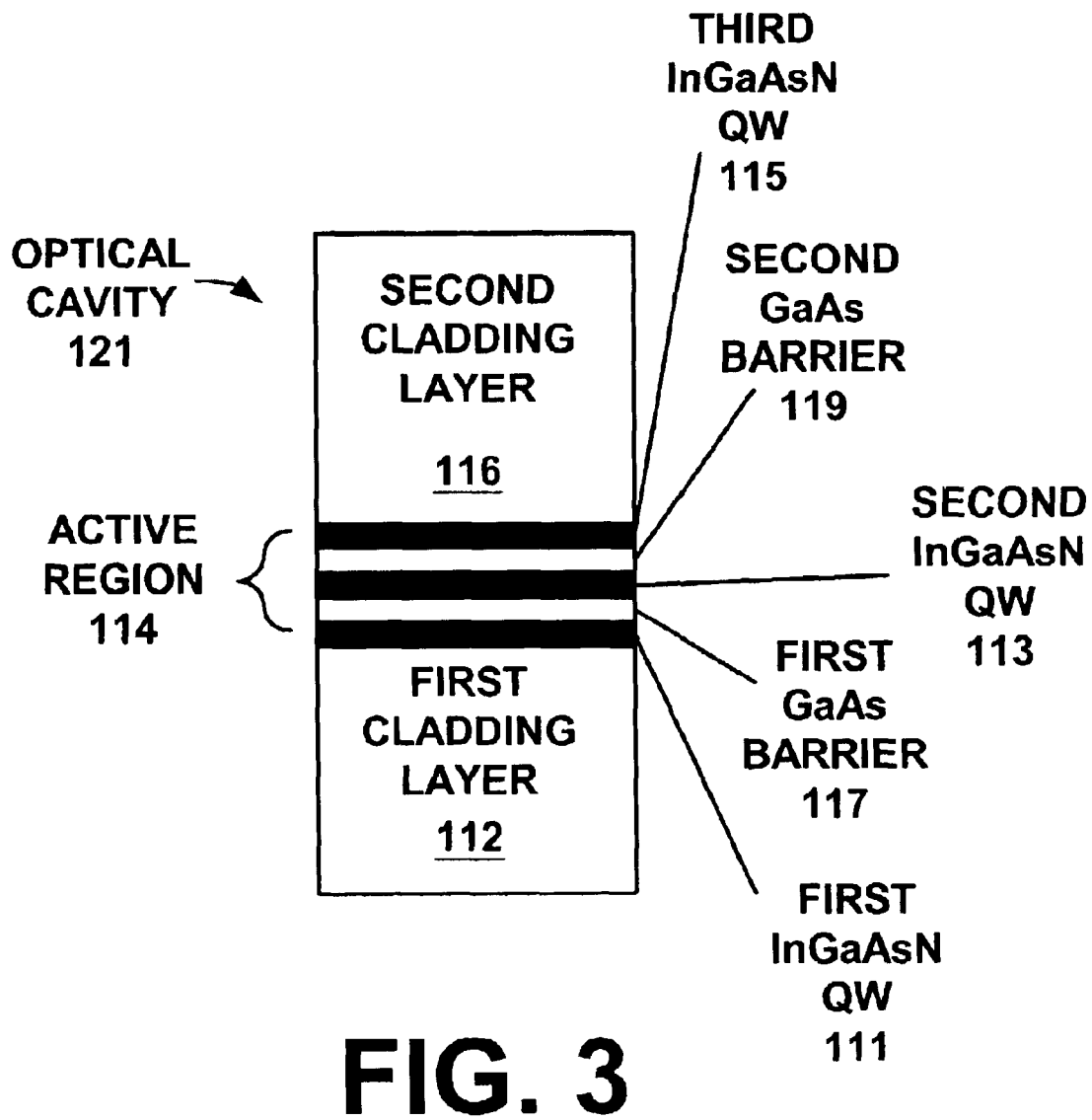
FIG. 3 is a schematic diagram further illustrating the optical cavity located within the VCSEL of FIG. 1.

An optical cavity 121 is located on the n-type DBR 108. The optical cavity 121 contains a first cladding layer 112 located on the n-type DBR 108 and an active region 114 located between the first cladding layer 112 and a second cladding layer 116. FIG. 3 is a schematic diagram further illustrating the optical cavity 121 located within the VCSEL of FIG. 1.

A p-type DBR 120 is located on the second cladding layer 116. In addition, a contact layer 122, made of GaAs, is located on the p-type DBR 120. A metal electrode 124 is located on the top of the contact layer 122. Materials utilized in the VCSEL 102 layers mentioned above, as well as the thickness of the layers, are described with reference to FIG. 2 described below with reference to a method by which the VCSEL 102 of FIG. 1 is fabricated. It should be noted that, while the description of FIG. 2 describes the VCSEL 102 and its fabrication, materials other than those disclosed in accordance with the first exemplary embodiment of the invention may be substituted for fabrication of parts of the VCSEL 102. The VCSEL 102 is fabricated via the metal organic chemical vapor deposition (MOCVD) semiconductor fabrication technique. As is known in the art, MOCVD uses liquid chemical precursors through which an inert carrier gas is passed to generate a chemical vapor that is passed over a heated semiconductor substrate located in a growth chamber, specifically referred to as an MOCVD reactor. Conditions in the MOCVD reactor are controlled so that the combination of gaseous precursors forms an epitaxial film as the vapors pass over the substrate. Use of an MOCVD reactor for growing the VCSEL 102 is assumed for exemplary purposes.

Figure 2:
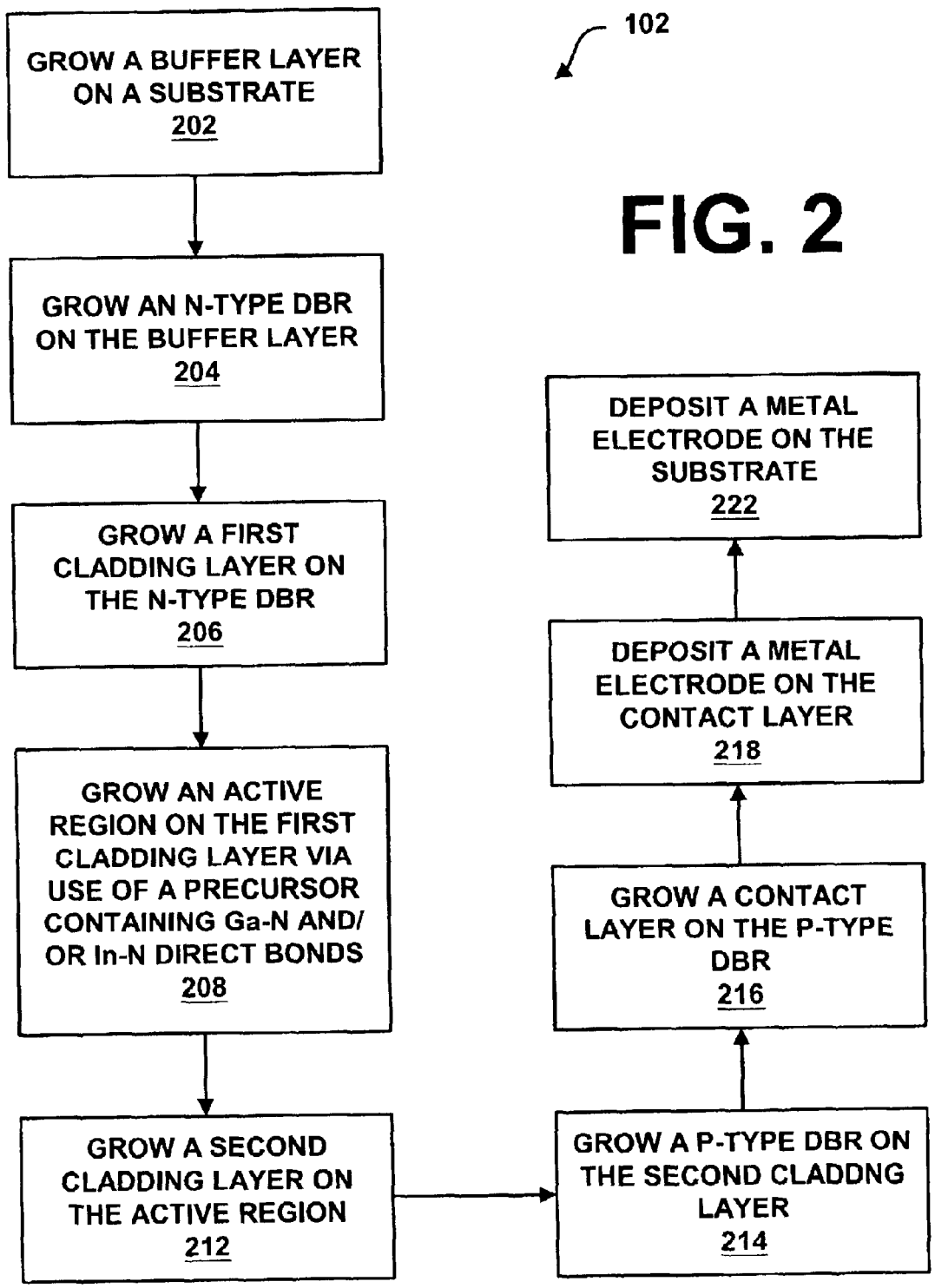
FIG. 2 is a flowchart illustrating the process of fabricating the VCSEL of FIG. 1.

FIG. 2 is a flowchart that shows a method according to the invention of fabricating a VCSEL, a portion of which contains an InGaAsN layer created via use of the present precursors. Each block of the flowcharts of the present disclosure represents a portion of the method. In some alternative implementations, the processes described in the blocks may be performed out of the order noted in the flowcharts. For example, two blocks shown in succession may in fact be performed substantially concurrently or the blocks may sometimes be performed in the reverse order.

While the following describes a method by which a single VCSEL 102 is fabricated, the fabrication process described with reference to FIG. 2 may also be utilized to fabricate a VCSEL layer structure from which multiple VCSELs, such as the VCSEL 102 of FIG. 1, may be made.

As shown by FIG. 1, the GaAs substrate 104 provides a foundation for growth of the VCSEL 102. In accordance with the first exemplary embodiment of the invention, the GaAs substrate 104 is an n-type GaAs substrate. The GaAs substrate 104 may be prepared for fabrication as follows. A GaAs substrate is transferred to a MOCVD reactor (discussed below with reference to FIG. 3). Reactor pressure is then decreased to approximately 50 millibar (mbar), and the atmosphere inside the MOCVD reactor is thoroughly replaced with nitrogen to remove oxygen and moisture. Hydrogen and arsine are introduced to the MOCVD reactor at a pressure in the range of 50–1000 mbar, after which the GaAs substrate is heated to 600–800 degrees C. for approximately five minutes to clean the GaAs substrate, thereby resulting in the GaAs substrate 104.

Referring additionally to FIG. 2, the buffer layer 106 is grown on the GaAs substrate 104 (block 202) within the MOCVD reactor. In accordance with the first exemplary embodiment of the invention, the buffer layer 106 is made of GaAs and is a Si-doped ($5 \times 10^{17}$–$5 \times 10^{18}$ cm$^{-3}$) n-type GaAs buffer layer that is 100–500 nanometers (nm) in thickness and is grown at a temperature between 600 and 800 degrees Celsius (C.). The GaAs buffer layer 106 may also have a thickness different from the above-mentioned. The GaAs buffer layer 106 compensates for surface imperfections of the GaAs substrate 104 such as, but not limited to, impurities at the surface of the GaAs substrate 104 and/or a non-flat surface.

In block 204, the n-type DBR 108 is grown on the GaAs buffer layer 106 at a temperature between 600 and 800 degrees Celsius (C.). In accordance with the first exemplary embodiment of the invention, the n-type DBR 108 contains 35–45 layer pairs, each composed of a Si-doped ($5 \times 10^{17}$–$5 \times 10^{18}$ cm$^{-3}$) Al$_x$Ga$_{1-x}$As ($0.8 < x \leq 1$) layer and a Si-doped ($5\times10^{17}$–$5\times10^{18}$ cm$^{-3}$) GaAs layer. The Si-doped Al$_x$Ga$_{1-x}$As layers are grown to a thickness corresponding to one quarter of the emission wavelength of the VCSEL 102 in the material of the layer. The Si-doped GaAs layers are also grown to a thickness corresponding to one quarter of the emission wavelength of the VCSEL 102 in the material of the layer with approximately 10–30 nm of linear grading at each interface between the Si-doped Al$_x$Ga$_{1-x}$As layer and the Si-doped GaAs layer. The reflectivity of a DBR is determined by the index of refraction difference between the materials that comprise the alternating layers of the DBR and the number of alternating layers used to construct the DBR. These parameters, as well as others, can be varied to fabricate a DBR having specific reflective properties.

The first cladding layer 112 is grown on the n-type DBR 108 (block 206). In accordance with the first exemplary embodiment of the invention, the first cladding layer 112 is made of GaAs, and is grown 150–170 nm thick. In addition, the first cladding layer 112 is grown at approximately 500–550 degrees C. The first cladding layer 112 may alternatively be fabricated using different materials, such as AlGaAs, InGaAsP, GaAsP, AlInGaAsN, or GaAsN. The material of the first cladding layer 112 depends upon the desired properties of the VCSEL 102, such as, for example, larger valence band offset and/or strain compensation for an active region (described below). It should be noted that a dopant is not added to materials of the first cladding layer 112, the active region 114 and the second cladding layer 116.

In block 208, the active region 114 is grown on the first cladding layer 112. Fabrication of the active region 114 may be performed in numerous ways. FIG. 3 is a schematic diagram further illustrating the optical cavity 121 of FIG. 1. In accordance with the first exemplary embodiment of the invention, the active region 114 illustrated by FIG. 3 contains three 6–10 nm thick InGaAsN quantum well layers, namely a first InGaAsN quantum well layer 111, a second InGaAsN quantum well layer 113, and a third InGaAsN quantum well layer 115, each of which is grown at approximately 500–600 degrees C. with triethygallium (TEGa), trimethylindium (TMIn), tertiarybutylarsine (TBAs) and a precursor containing Ga—N and/or In—N, which is introduced by the present semiconductor laser fabrication system and method.

Two 5–30 nm thick barrier layers, namely a first barrier layer 117 and a second barrier layer 119, that are made of GaAs, are grown within the active region 114. Specifically, the first barrier layer 117 is grown between the first InGaAsN quantum well layer 111 and the second InGaAsN quantum well layer 113. In addition, the second barrier layer 119 is grown between the second InGaAsN quantum well layer 113 and the third InGaAsN quantum well layer 115. Instead of being made of GaAs, the barrier layers 117, 119 may be made of GaAsN, GaAsP, InGaP, InGaAs, InGaAsP, or InGaAsN to obtain desired VCSEL 102 properties, such as larger carrier confinement and/or strain compensation for InGaAsN quantum well layers 111, 113, 115.

It should be noted that the first cladding layer 112 functions as a barrier layer for the first InGaAsN quantum well layer 111. In addition, the second cladding layer 116 functions as a barrier layer for the third InGaAsN quantum well layer 115. Therefore, each InGaAsN quantum well layer 111, 113, 115 is located between either a cladding layer 112, 116 and a GaAs barrier layer 117, 119, or between two GaAs barrier layers 117, 119.

Figure 4:
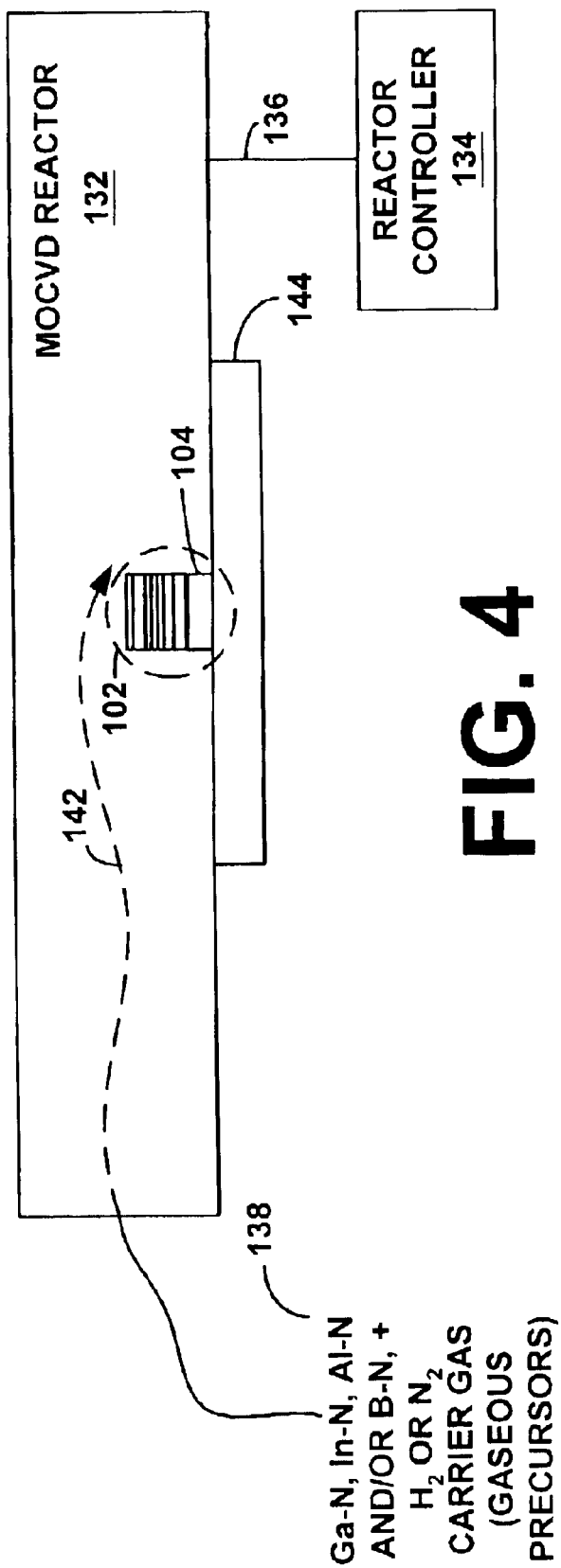
FIG. 4 is a schematic diagram illustrating an MOCVD reactor used to grow the active region of the VCSEL of FIG. 1.

The active region 114 may alternatively contain a single 6–10 nm InGaAsN quantum well layer. In accordance with the alternative embodiment, growth of the 6–10 nm InGaAsN quantum well layer is performed by supplying trimethylindium (TMIn) and the precursor containing the Ga—N and/or In—N direct bonds to an MOCVD reactor 132 (FIG. 4) (discussed below), in addition to TEGa and TBAs. If a multiple quantum well layer structure is desired, as in the active region 114 of FIG. 3, the GaAs barrier layer 117, 119 may be grown on an InGaAsN quantum well layer 111, 113, 115 by discontinuing the flow of TMIn and the precursor containing the Ga—N and/or In—N direct bonds from the MOCVD reactor 132 (FIG. 4). It should be noted that the growth of InGaAsN quantum well layers 111, 113, 115 may be repeated as many times as desired.

The use of InGaAsN in the active region 114 provides the desired electron and hole confinement in the active region 114. If, instead, the prior art InGaAsP/InP material system were used to obtain VCSELs generating light with wavelengths in the wavelength range 1.2–1.6 µm, the electrons would not be well confined within the active region 114, resulting in increased carrier overflow from the active region 114 at the operating temperature of the VCSEL 102. Heat generated in the VCSEL 102 results in decreased laser performance due to an increase in threshold current density that causes the VCSEL 102 to consume additional current. As a result, a cooling system may be required by VCSELs having an InGaAsP active region, which is undesirable.

Referring back to FIG. 2 and FIG. 1, the second cladding layer 116, which, in accordance with the first exemplary embodiment of the invention, is made of GaAs, is grown on the active region 114 (block 212). In accordance with the first exemplary embodiment of the invention, the second cladding layer 116 is 150–170 nm thick and is grown at a temperature of approximately 600–800 degrees C. The second cladding layer 116 may alternatively be fabricated using different materials, such as AlGaAs, InGaAsP, GaAsP, AlInGaAsN, or GaAsN. For example, the material of the layer depends upon the desired properties of the VCSEL 102, such as larger conduction band offset and/or strain compensation for the active region 114.

It should be noted that the combination of the first and second cladding layers 112, 116 and the active region 114 is referred to as the optical cavity 121. The thickness of the optical cavity 121 preferably corresponds to n times the wavelength of light to be emitted by the VCSEL 102 in the materials of the optical cavity 121, where n is an integer. As an example, assuming that n equals 1 and the desired wavelength of emitted light is 1.3 µm, the thickness of the optical cavity 121 is approximately 380 nm, which is 1.3 µm divided by the refractive index of GaAs, which is 3.4. In accordance with the first exemplary embodiment of the invention, n is between 1 and 3. Of course, other values for n may also be used.

In block 214, the p-type DBR 120 is grown on the second cladding layer 116. In accordance with the first exemplary embodiment of the invention, the p-type DBR 120 contains 20–35 layer pairs, each composed of a C-doped ($5\times10^{17}$–$5\times10^{18}$ cm$^{-3}$) Al$_x$Ga$_{1-x}$As ($0.8 < x \leq 1$) layer and a ($5\times10^{17}$–$5\times10^{18}$ cm$^{-3}$) C-doped Al$_y$Ga$_{1-y}$As ($0 \leq y < 0.2$) layer. The C-doped Al$_x$Ga$_{1-x}$As layers are grown to a thickness corresponding to one quarter of the emission wavelength of the VCSEL 102 in the material of the layer. The C-doped Al$_y$Ga$_{1-y}$As layers are also grown to a thickness corresponding to one quarter of the emission wavelength of the VCSEL 102 in the material of the layer with approximately 10–30 nm of linear grading at each interface between the C-doped Al$_x$Ga$_{1-x}$As and the C-doped Al$_y$Ga$_{1-y}$As.

The p-type DBR 120 may include a 10–30 nm C-doped Al$_z$Ga$_{1-z}$As layer that will be used to make a laterally oxidized layer for the purpose of providing current confinement. The value of z in the $Al_zGa_{1-z}As$ layer is selected to be higher than the value of x selected for other C-doped $Al_xGa_{1-x}As$ layers in the VCSEL 102 since the rate of oxidation is strongly dependent on the Al content of the C-doped $Al_xGa_{1-x}As$ layer. U.S. Pat. No. 5,896,408, provides an example of oxidized layer structures and is incorporated by reference in its entirety. It should also be noted that ion implantation may also be used to realize current confinement either alone or in conjunction with the laterally oxidized layer structure.

In block 216, growth of the p-type DBR 120 is completed with the GaAs contact layer 122 over the p-type DBR 120. In accordance with the first exemplary embodiment of the invention, the GaAs contact layer 122 is 50–100 nm thick and heavily C-doped ($5 \times 10^{18}$–$1 \times 10^{20}$ $cm^{-3}$). The C-doped GaAs contact layer 122 provides a low resistance p-contact with a deposited metal electrode 124. The metal electrode 124 is deposited on the C-doped GaAs contact layer 122 (block 218) to provide an electrical connection to the contact layer 122. The VCSEL 102 also contains metal electrode 126, which is deposited on the GaAs substrate 104 (block 222) via a metal deposition process to provide an electrical connection to the GaAs substrate 104.

An example of a MOCVD reactor 132 that can be used to grow the VCSEL 102 in accordance with the first embodiment of the invention will now be described with reference to FIG. 4, and with additional reference to FIG. 1. Many of the details of the MOCVD reactor 132 are omitted for clarity since the details of the MOCVD reactor 132 are known in the art. A reactor controller 134 is coupled to the MOCVD reactor 132 via connection 136. The reactor controller 134 controls various operating aspects and parameters of the MOCVD reactor 132. As will be described in greater detail below, the reactor controller 134 is used to control, among other parameters, the amount of precursor introduced to the MOCVD reactor 132 during epitaxial growth.

To facilitate MOCVD epitaxial growth, an inert carrier gas is bubbled through the constituent precursor compounds so that a saturated gaseous precursor is created for each compound. The saturated gaseous precursors are diluted with other gases and are transported into the MOCVD reactor 132 by the carrier gas. The saturated precursors pass over a heated substrate wafer (e.g., the GaAs substrate 104), yielding constituent atomic elements. Arrow 142 illustrates passing of the saturated precursors over the heated substrate wafer. The atomic elements are deposited on the heated substrate wafer, where they bond to the underlying crystal structure of the substrate wafer to form an epitaxial layer.

In the example shown in FIG. 4, and to facilitate the growth of an InGaAsN quantum well layer, the gaseous precursors 138 include Ga—N and/or In—N direct bonds, tertiarybutylarsine (TBAs), gallium precursor triethylgallium (TEGa), and indium precursor trimethylindium (TMIn). Other gaseous precursors can also be used depending on the desired composition of the epitaxial layers. The carrier gas can be, for example, hydrogen ($H_2$) or nitrogen ($N_2$). The carrier gas is bubbled through the gaseous precursors. The resultant gaseous precursors and inert carrier gas are subsequently combined into a gaseous mixture of the appropriate concentrations, and the mixture passes into the MOCVD reactor 132.

To achieve optimum layer thickness, composition uniformity and interface abruptness, additional carrier gas may be introduced to increase mixture flow velocity. A heated susceptor 144 includes a heated surface that is typically made of graphite, silicon carbide, or molybdenum, on which the GaAs substrate 104 of the VCSEL 102 resides. The n-type GaAs buffer layer 106, n-type DBR 108, first cladding layer 112, active region 114, second cladding layer 116, p-type DBR 120, and contact layer 122 are grown over the GaAs substrate 104 to form the VCSEL 102.

Edge-Emitting Laser

Figure 5:
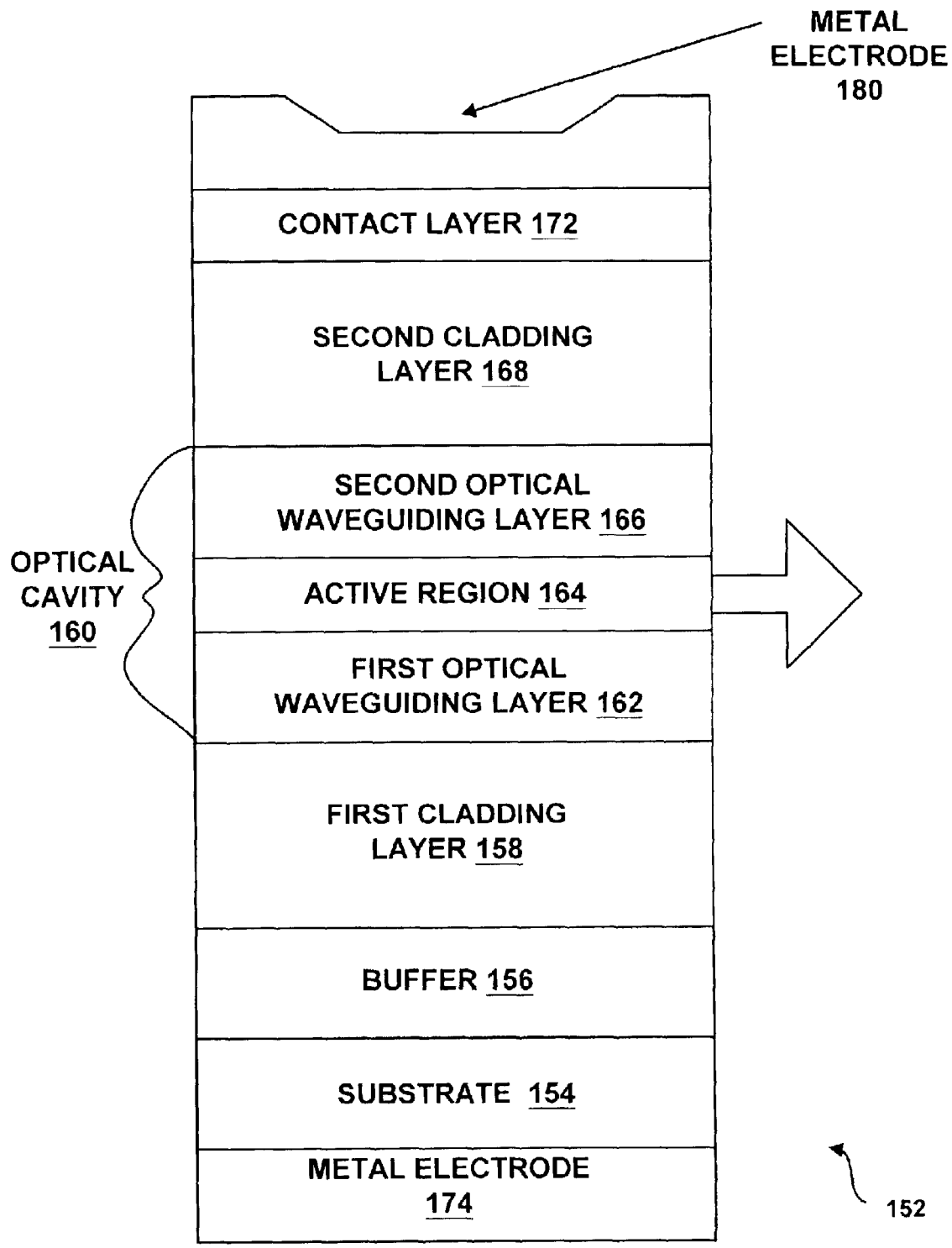
FIG. 5 is a schematic diagram illustrating an example of an edge-emitting laser, a portion of which contains an InGaAsN layer created via use of the present precursors.

As mentioned above, InGaAsN is an attractive material not only for fabricating the active region of VCSELs, such as the VCSEL illustrated in FIG. 1, but also of long wavelength edge-emitting lasers. A long wavelength edge-emitting laser will be described below in accordance with a second exemplary embodiment of the invention. FIG. 5 is a schematic diagram illustrating an edge-emitting laser 152, a portion of which contains InGaAsN fabricated using the present fabrication system and method.

The edge-emitting laser 152 contains several layers, each of which is discussed in detail below. Specifically, the edge-emitting laser 152 contains a substrate 154, made of GaAs, the bottom of which has an n-type electrode layer 174 located thereon. A buffer layer 156, composed of GaAs, is located on the GaAs substrate 154. A first cladding layer 158, made of AlGaAs, is located on the buffer layer 156.

A first optical waveguiding layer 162, made of GaAs, is located on the first cladding layer 158. An active region 164 is located on the first optical waveguiding layer 162. A second optical waveguiding layer 166, made of GaAs, is located on the active region 164. The combination of the first optical waveguiding layer 162, the active region 164 and the first optical waveguiding layer 162 is referred to as an optical cavity 160. A second cladding layer 168, made of AlGaAs, is located on the second optical waveguiding layer 166. In addition, a contact layer 172, made of GaAs, is located on the top of the second cladding layer 168. A metal electrode 180 is located on the contact layer 172. It should be noted that, while the following further describes the edge-emitting laser 152 and its fabrication, materials other than those disclosed in accordance with the second exemplary embodiment of the invention may be substituted for fabrication of parts of the edge-emitting laser 152.

Figure 6:
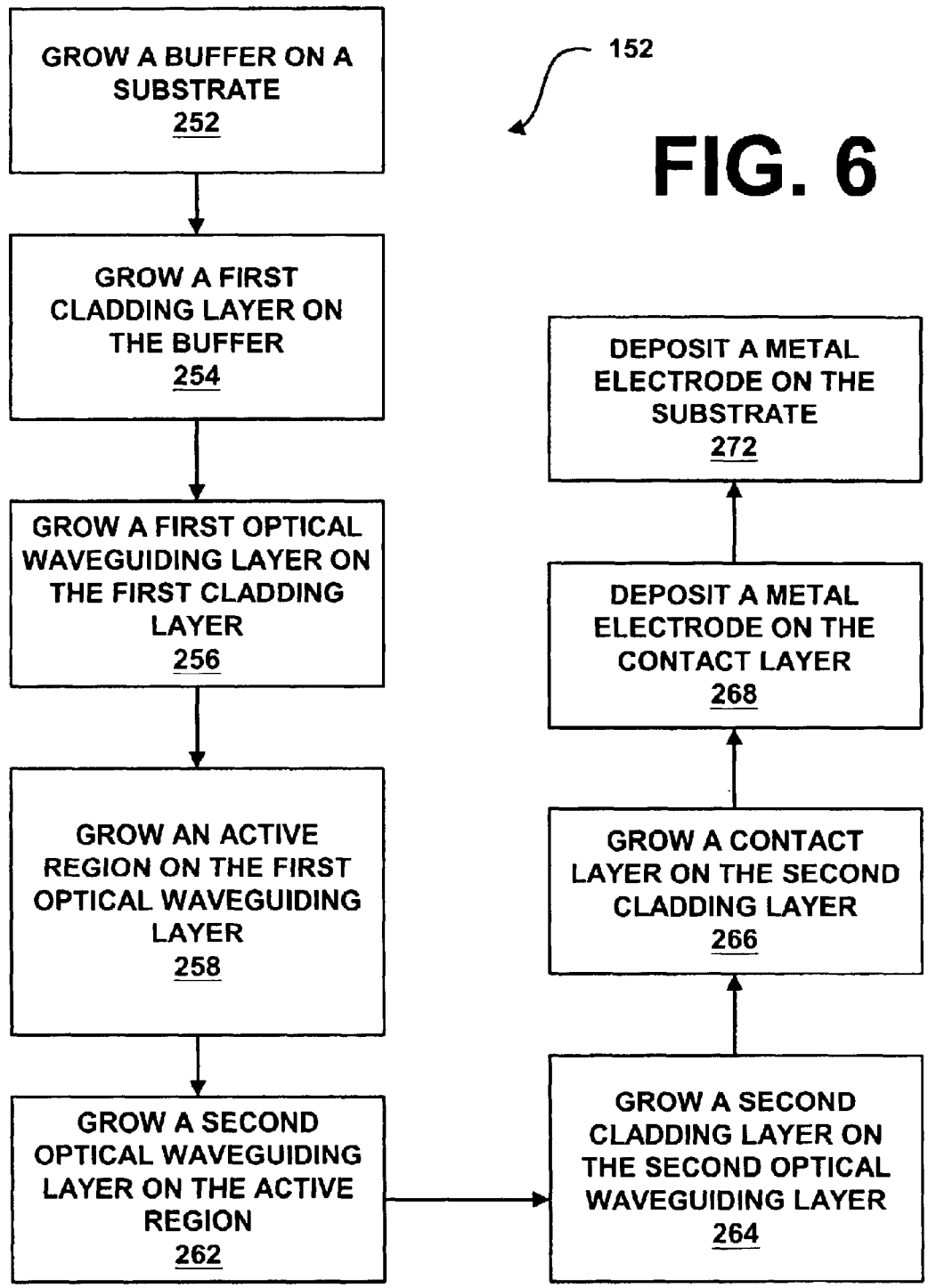
FIG. 6 is a flowchart illustrating the process of fabricating the edge-emitting laser of FIG. 4.

Materials utilized in the edge-emitting laser 152 portions mentioned above, and the thickness of the layers, are described below with reference to the method of FIG. 6, which describes edge-emitting laser 152 fabrication. Referring additionally to FIG. 5, to fabricate the edge-emitting laser 152, the GaAs substrate 154 is transferred to the MOCVD reactor 132. In accordance with the second exemplary embodiment, the GaAs substrate 154 is an epi-ready, n-type GaAs substrate 154. Reactor pressure is then decreased to approximately 50 millibar (mbar), and the atmosphere inside the MOCVD reactor 132 is thoroughly replaced with nitrogen to remove oxygen and moisture. Hydrogen and arsine are introduced at a pressure in the range of 50–1000 mbar, after which the GaAs substrate is heated to a temperature of 600–800 degrees C. for approximately five minutes to clean the GaAs substrate.

As shown by block 252, the GaAs buffer layer 156 is grown on the GaAs substrate 154. In accordance with the first exemplary embodiment, the GaAs buffer layer 156 is 100–500 nm thick, Si-doped ($1 \times 10^{17}$–$5 \times 10^{18}$ $cm^{-3}$) and is grown at a temperature of 600–800 degrees C. using trimethylgallium (TMGa), disilane ($Si_2H_6$), and arsine ($AsH_3$) under 50–1000 mbar $H_2$ ambient pressure. The GaAs buffer layer 156 provides a smooth surface on the GaAs substrate 154.

The first cladding layer 158 is grown on the GaAs buffer layer 156 (block 254). In accordance with the second exemplary embodiment, the first cladding layer 158 is a 1500–2500 nm thick layer of Si-doped ($1 \times 10^{17}$–$5 \times 10^{18}$ cm$^{-3}$) Al$_{0.3}$Ga$_{0.7}$As that is grown on the GaAs buffer layer 156 by additionally providing a flow of Trimethylaluminum (TMAl) to the MOCVD reactor 132. As is known by those having ordinary skill in the art, the AlGaAs cladding layer 158 and first optical waveguiding layer 162 collectively provide optical confinement for light generated in the active region (discussed below) of the edge-emitting laser 152. The AlGaAs cladding layer 158 may have a higher Al mole fraction than that of Al$_{0.3}$Ga$_{0.7}$As, to provide a larger difference in the refractive indices between the first AlGaAs cladding layer 158 and the first GaAs optical waveguiding layer 162, resulting in larger optical confinement and reduction of threshold current density. In addition, in accordance with an alternative embodiment, the AlGaAs cladding layer 158 may be replaced with an InGaP cladding layer to provide desired properties such as larger optical confinement.

The first GaAs optical waveguiding layer 162 is grown on the first AlGaAs cladding layer 158 (block 256). The first GaAs optical waveguiding layer 162 is grown by discontinuing the flow of TMAl and Si$_2$H$_6$ from the MOCVD reactor 132 (FIG. 4) until a 100–200 nm thick first GaAs optical waveguiding layer 162 is grown. It should be noted that no dopants are added to the MOCVD reactor 132 during growth of the first GaAs optical waveguiding layer 162, the active region 164 and the second GaAs optical waveguiding layer 166. The temperature within the MOCVD reactor 132 is gradually decreased to a temperature of 500–550 degrees C. during growth of the first GaAs optical waveguiding layer 162.

In block 258, the active region 164 is grown on the first GaAs optical waveguiding layer 162. In accordance with the second exemplary embodiment of the invention, the active region 164 contains an InGaAsN quantum well layer that is 6–10 nm thick. For growth of a 6–10 nm thick InGaAsN quantum well layer, trimethylindium (TMIn) and the precursor containing the Ga—N and/or In—N direct bonds are supplied to the MOCVD reactor 132 in addition to TEGa and TBAs. If a multiple quantum well layer structure is required in the edge-emitting laser 152, GaAs barrier layers may be grown between InGaAsN quantum well layers by discontinuing the flow of TMIn and the precursor containing the Ga—N and/or In—N direct bonds from the MOCVD reactor 132 during the growth of each GaAs barrier layer. The growth of InGaAsN quantum well layers and GaAs barrier layers can be repeated as many times as desired. A barrier layer may be fabricated using different materials, such as GaAsN, GaAsP, InGaP, InGaAs, InGaAsP, or InGaAsN to obtain desired properties, such as larger carrier confinement and/or strain compensation for InGaAsN quantum well layers.

The second GaAs optical waveguiding layer 166 is grown on the active region 164 (block 262). In accordance with the second exemplary embodiment of the invention, the second GaAs optical waveguiding layer 166 is a 100–200 nm thick layer of GaAs that is grown as the temperature within the MOCVD reactor 132 (FIG. 3) is increased to between 600–800 degrees C.

In block 264 the second AlGaAs cladding layer 168 is grown on the second GaAs optical waveguiding layer 166. In accordance with the second exemplary embodiment of the invention, the second AlGaAs cladding layer 168 is a 1.5–2.5 µm thick, C-doped ($1 \times 10^{17}$–$5 \times 10^{18}$ cm$^{-3}$) layer of Al$_{0.3}$Ga$_{0.7}$As. As with the first AlGaAs cladding layer 158, the second AlGaAs cladding layer 168 may have a higher Al mole fraction than that of Al$_{0.3}$Ga$_{0.7}$As, to provide a larger difference in the refractive indices between the second AlGaAs cladding layer 168 and the GaAs optical waveguiding layers 162, 166, resulting in larger optical confinement and reduction of threshold current density. In addition, in accordance with an alternative embodiment, the second AlGaAs cladding layer 168 may be replaced with an InGaP cladding layer to provide desired properties such as larger optical confinement.

The GaAs contact layer 172 is grown on the second AlGaAs cladding layer 168 (block 266). In accordance with the second exemplary embodiment of the invention, the contact layer 172 is a 50–200 nm thick layer of heavily C-doped ($5 \times 10^{18}$–$1 \times 10^{20}$ cm$^{-3}$) GaAs. The GaAs contact layer 172 provides a low-resistance p-type contact for the metal electrode 180 that is deposited thereon (block 268). The metal electrode 180 is used to provide current to the edge-emitting laser 152. The edge-emitting laser 152 also contains metal electrode 174 deposited on the GaAs substrate 154 (block 272) via a metal deposition process.

In accordance with alternative embodiments of the invention, precursors containing a direct bond between an aluminum atom and a nitrogen atom (Al—N) and/or a direct bond between a boron atom and a nitrogen atom (B—N) are used. The precursors containing Al—N and/or B—N direct bonds are also effective to enhance N incorporation within semiconductor lasers in the same manner as that provided by the precursors containing Ga—N and/or In—N direct bonds. Examples of materials grown by use of precursors containing Al—N and B—N direct bonds include InAlAsN and InBAsN.

Examples of precursors having Al—N direct bonds include, but are not limited to, diethylaluminum azide (C$_2$H$_5$)$_2$AlN$_3$, dimethylaluminum amide (CH$_3$)$_2$AlNH$_2$ and dimethylamino diethylaluminum (C$_2$H$_5$)$_2$AlN(CH$_3$)$_2$. In addition, examples of precursors having B—N direct bonds include, but are not limited to, diethylboron azide (C$_2$H$_5$)$_2$BN$_3$, dimethylboron amide (CH$_3$)$_2$BNH$_2$ and dimethylamino diethylboron (C$_2$H$_5$)$_2$BN(CH$_3$)$_2$.

It should be emphasized that the above-described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

We claim:

1. A system for fabricating a light emitting device, comprising:
    a growth chamber; and
    at least one nitrogen precursor that is introduced to said growth chamber, said nitrogen precursor having a direct bond between at least one group III atom and at least one nitrogen atom, and being introduced to said growth chamber to fabricate a layer constituting part of an active region of said light emitting device, said layer comprising indium, gallium, arsenic and nitrogen, wherein said active region produces light having a wavelength in a range of approximately 1.2 to 1.6 micrometers.

2. The system of claim 1, wherein said direct bond is selected from the group consisting of a gallium-nitrogen direct bond and an indium-nitrogen direct bond.

3. The system of claim 1, wherein said direct bond is selected from the group consisting of an aluminum-nitrogen direct bond, resulting in said active region further comprising aluminum, and a boron-nitrogen direct bond, resulting in said active region further comprising boron.

4. The system of claim 1, wherein said growth chamber is a metal organic chemical vapor deposition reactor.

5. The system of claim 1, wherein a required flow rate of said at least one nitrogen precursor for fabrication of said layer comprising indium, gallium, arsenic and nitrogen is approximately one-thousand times lower than the flow rate would be if a nitrogen precursor lacking said direct bond were used.

6. The system of claim 1, wherein said nitrogen precursor is selected from the group consisting of diethylgallium azide $(C_2H_5)_2GaN_3$, dimethylgallium amide $(CH_3)_2GaNH_2$, dimethylamino diethylgallium $(C_2H_5)_2GaN(CH_3)_2$, diethylindium azide $(C_2H_5)_2InN_3$, dimethylindium amide $(CH_3)_2InNH_2$, and dimethylamino diethylindium $(C_2H_5)_2InN(CH_3)_2$.

7. The system of claim 1, wherein said nitrogen precursor is selected from the group consisting of diethylaluminum azide $(C_2H_5)_2AlN_3$, dimethylaluminum amide $(CH_3)_2AlNH_2$, dimethylamino diethylaluminum $(C_2H_5)_2AlN(CH_3)_2$, diethylboron azide $(C_2H_5)_2BN_3$, dimethylboron amide $(CH_3)_2BNH_2$, and dimethylamino diethylboron $(C_2H_5)_2BN(CH_3)_2$.

8. A light emitting device, comprising:
   a substrate;
   an optical cavity; and
   an active region located within said optical cavity, said active region comprising indium (In), gallium (Ga), arsenic (As), and nitrogen (N), wherein said active region produces light having a wavelength in the range of approximately 1.2 to 1.6 micrometers, and wherein at least a portion of said active region is grown via use of a nitrogen precursor having a direct bond between at least one group III atom and at least one nitrogen atom.

9. The light emitting device of claim 8, wherein said active region further comprises at least one indium gallium arsenide nitride quantum well layer and at least one gallium arsenide barrier layer.

10. The light emitting device of claim 8, wherein said direct bond is selected from the group consisting of a gallium-nitrogen bond and an indium-nitrogen bond.

11. The light emitting device of claim 8, wherein said direct bond is selected from the group consisting of an aluminum-nitrogen bond, resulting in said active region further comprising aluminum, and a boron-nitrogen bond, resulting in said active region further comprising boron.

12. The light emitting device of claim 8, wherein a required flow rate of said at least one nitrogen precursor for fabrication of said active region is approximately one-thousand times lower than the flow rate would be if a different precursor was used.

13. The light emitting device of claim 8, further comprising:
   a first distributed Bragg reflector; and
   a second distributed Bragg reflector, wherein said optical cavity is located between said first distributed Bragg reflector and said second distributed Bragg reflector.

14. The light emitting device of claim 13, wherein said first distributed Bragg reflector further comprises a series of layer pairs, each pair within said series of layer pairs being composed of a silicon doped aluminum $(Al)_xGa_{1-x}As$ $(0.8 < x \leq 1)$ layer and a silicon doped gallium arsenide layer.

15. The light emitting device of claim 13, wherein said second distributed Bragg reflector further comprises a series of layer pairs, each pair within said series of layer pairs being composed of an aluminum $(Al)_xGa_{1-x}As$ $(0.8 < x \leq 1)$ layer and an $Al_yGa_{1-y}As$ $(0 \leq y < 0.2)$ layer.

16. The light emitting device of claim 8, wherein said optical cavity further comprises:
   a first optical waveguiding layer; and
   a second optical waveguiding layer, wherein said active region is located between said first optical waveguiding layer and said second optical waveguiding layer.

17. The light emitting device of claim 16, further comprising:
   a first cladding layer; and
   a second cladding layer, wherein said optical cavity is located between said first cladding layer and said second cladding layer.

18. The light emitting device of claim 8, wherein said nitrogen precursor is selected from the group consisting of diethylgallium azide $(C_2H_5)_2GaN_3$, dimethylgallium amide $(CH_3)_2GaNH_2$, dimethylamino diethylgallium $(C_2H_5)_2GaN(CH_3)_2$, diethylindium azide $(C_2H_5)_2InN_3$, dimethylindium amide $(CH_3)_2InNH_2$, and dimethylamino diethylindium $(C_2H_5)_2InN(CH_3)_2$.

19. The light emitting device of claim 8, wherein said nitrogen precursor is selected from the group consisting of diethylaluminum azide $(C_2H_5)_2AlN_3$, dimethylaluminum amide $(CH_3)_2AlNH_2$, dimethylamino diethylaluminum $(C_2H_5)_2AlN(CH_3)_2$, diethylboron azide $(C_2H_5)_2BN_3$, dimethylboron amide $(CH_3)_2BNH_2$, and dimethylamino diethylboron $(C_2H_5)_2BN(CH_3)_2$.

20. A method for fabricating a semiconductor structure, the method comprising:
   providing a substrate; and
   growing over said substrate a layer comprising indium (In), gallium (Ga), arsenic (As), and nitrogen (N) using at least one nitrogen precursor having a direct bond between at least one group III atom and at least one nitrogen atom.

21. The method of claim 20, wherein said direct bond is selected from the group consisting of a gallium-nitrogen direct bond and an indium-nitrogen direct bond.

22. The method of claim 20, wherein said InGaAsN layer comprises at least one InGaAsN quantum well layer.

23. The method of claim 20, wherein said InGaAsN layer generates light having a wavelength in the range of approximately 1.2 to 1.6 micrometers.

24. The method of claim 20, wherein said direct bond is selected from the group consisting of an aluminum-nitrogen bond, resulting in said InGaAsN layer further comprising aluminum, and a boron-nitrogen bond, resulting in said InGaAsN layer further comprising boron.

25. The method of claim 20, wherein a required flow rate of said at least one nitrogen precursor for growing said layer comprising indium (In), gallium (Ga), arsenic (As), and nitrogen (N) is approximately one-thousand times lower than the flow rate would be if a nitrogen precursor lacking said direct bond were used.

26. The method of claim 20, wherein said nitrogen precursor is selected from the group consisting of diethylgallium azide $(C_2H_5)_2GaN_3$, dimethylgallium amide $(CH_3)_2GaNH_2$, dimethylamino diethylgallium $(C_2H_5)_2GaN(CH_3)_2$, diethylindium azide $(C_2H_5)_2InN_3$, dimethylindium amide $(CH_3)_2InNH_2$, and dimethylamino diethylindium $(C_2H_5)_2InN(CH_3)_2$.

27. The method of claim 20, wherein said nitrogen precursor is selected from the group consisting of diethylaluminum azide $(C_2H_5)_2AlN_3$, dimethylaluminum amide $(CH_3)_2AlNH_2$, dimethylamino diethylaluminum $(C_2H_5)_2AlN(CH_3)_2$, diethylboron azide $(C_2H_5)_2BN_3$, dimethylboron amide $(CH_3)_2BNH_2$, and dimethylamino diethylboron $(C_2H_5)_2BN(CH_3)_2$.

* * * * *